(12) United States Patent
Kurshan et al.

(10) Patent No.: US 6,591,231 B1
(45) Date of Patent: Jul. 8, 2003

(54) METHOD FOR IDENTIFYING CYCLICITY IN CIRCUIT DESIGNS

(75) Inventors: Robert Paul Kurshan, New York, NY (US); Kedar Sharadchandra Namjoshi, Westfield, NJ (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 09/347,628

(22) Filed: Jul. 2, 1999

(51) Int. Cl.$^7$ ................................................. G06F 7/60
(52) U.S. Cl. .............................. 703/2; 703/14; 703/15; 703/16; 716/2; 716/5; 716/6; 716/4
(58) Field of Search ................................ 703/6, 14, 15, 703/16, 2; 716/2, 5, 6, 8, 4, 10, 18

(56) References Cited

U.S. PATENT DOCUMENTS

| | | | | |
|---|---|---|---|---|
| 5,491,640 A | * | 2/1996 | Sharma et al. | 716/18 |
| 6,012,836 A | * | 1/2000 | Mangelsdorf | 703/6 |
| 6,075,932 A | * | 6/2000 | Khouja et al. | 716/4 |

OTHER PUBLICATIONS

Malik, "Analysis of Cyclic combinational circuits", Transactions on computer aided design of Integrated circuits and systems, Jul. 1994.*
Namjoshi et al., "Efficient analysis of cyclic definitions", Bell Laboratoties, 1999.*
Shiple, "Formal analysis of synchronous circuits", A dissertation to the University of california, Berkeley, 1996.*
Brzozowski et al., "Asynchronous circuits", 1996.*
Berry, "The constructive semantics of pure Esterel Draft version 2.0", May 1996.*
Scott, "A type–theoritical alternative to ISWIM, CUCH OWHY", Theoretical Computer Science, 1993.*
Bakker et al., "Control Flow Semantics", MIT, 1996.*
Cousot, "Asynchronous iterative methods for solving a fixed point system of Monotone equations in a complete lattice", Sep. 1997.*
Katzenelson et al., "S/R: A language for specifying protocols and other coordinating processes", IEEE, 1986.*
Shiple, T.R. et al., "Constructive Analysis of Cyclic Circuits", IEEE Catalog No.: 96TB100027, Mar. 1996.*
Srinivasa et al., "Practical analysis of cyclic combinational circuits", Proceedings of IEEE Custom Integrated Circuits conference, May 1996.*

* cited by examiner

Primary Examiner—Samuel Broda
Assistant Examiner—Kandasamy Thangavelu
(74) Attorney, Agent, or Firm—John Ligon

(57) ABSTRACT

A method for checking on cyclicity of a set of definitions employs a simple, non-computational definition of constructivity and a symbolic algorithm based on the new, simple to implement, formulation for variables with arbitrary finite types. This is accomplished by extending variable type to include the "undeterminable" value ⊥ (read as "bottom"). This formulation is non-computational and easily extensible to variables with any finite type. The formulation also handles definitions of indexed variables in the same manner. The set of definitions is then checked to determine whether any of the variables assume the value is ⊥.

8 Claims, 1 Drawing Sheet

METHOD FOR IDENTIFYING CYCLICITY IN CIRCUIT DESIGNS

BACKGROUND OF THE INVENTION

This invention relates to computer aided circuit design.

A circuit may be described as a set of definitions, with each definition specifying a gate of the circuit. For most circuits, the induced dependency graph of such a set of definitions is acyclic. That is, the circuit contains no feedback loops (without clocked delay elements) which may cause uncertainty in the state that the system must take on or, indeed, may cause the circuit to not settle to any stable state. In reviewing the set of definitions that together define a circuit, an individual definition or (more typically) a collection of definitions may be found to be semantically cyclic, or syntactically cyclic. A definition is syntactically cyclic when a variable p is expressed in terms of itself, or in terms of at least one other variable, q, that is effectively expressed in terms of p. A semantically cyclic definition is one that, for at least one valuation (e.g. with a specific valuation of one or more external variables of the circuit), a syntactically acyclic condition does not exist.

Syntactic cyclic definitions occur in many contexts in digital designs. S. Malik in "Analysis of cyclic combinational circuits", *IEEE Transactions on Computer-Aided Design*, 1994, points out that it is often desirable to re-use functional units by connecting them in cyclic fashion through a routing mechanism, and L. Stok in "False loops through resource sharing", in *International Conference on Computer-Aided Design*, 1992, notes that such definitions often arise in the output of synthesis programs. In these cases, the intention is that the routing mechanisms can be controlled through external inputs, so that any "semantically" cyclic paths are broken for each valuation of the external "free" inputs and clocked delay elements (such as clocked latches).

Semantically cyclic definitions may, for example, occur inadvertently in systems composed of several Mealy machines, from feedback connections between the combinational inputs and outputs.

Verification systems that accept semantically cyclic definitions obviously run the risk of certifying systems that have the unacceptable behavior associated with a cyclic condition. On the other hand, verification systems that prohibit syntactically cyclic definitions reject circuit definitions that might be certified by formal verification as being free from cyclic conditions. Most current design and verification systems either prohibit all syntactically cyclic definitions, or accept only some of the semantically acyclic definitions that could be accepted.

The Esterel compiler appears to be the only known existing system that analyzes definitions for semantic cyclicity, using the notion of "constructivity" proposed by Berry, *The Constrictive Semantics of Esterel*, Draft book, available at ftp://ftp-sop.inria.fr/meije/esterel/papers/constructiveness.ps.gz, 1995, which considers a circuit to be semantically acyclic iff for every external input, a unique value can be derived for each internal wire by a series of inferences on the definition of the circuit (a more precise statement is given below). T. Shiple, "Formal Analysis of Synchronous Circuits", *PhD dissertation*, University of California, Berkeley, 1996, shows that constructive definitions are precisely those that are well-behaved electrically, for any assignment of delay values, in the up-unbounded inertial delay model defined in by J. A. Brzozowski and C-J. H. Seger in "Asynchronous Circuits", Springer Verlag, 1994.

The work most related to this disclosure is described in the aforementioned Berry article and the aforementioned Shiple dissertation. Berry proposed the original operational formulation of constructivity (Constructivity) and the computational formulation (Constructivity-FIX), based on work by Malik's aforementioned article. These definitions are based on computational processes—one would prefer a non-computational definition of the concept of "semantic acyclicity". See also T. Shiple, G. Berry and H. Touati, "Constructive analysis of cyclic circuits", in *European Design and Test Conference*, 1996. The above references employ symbolic, fixpoint-based algorithms to check constructivity. These algorithms are difficult to implement and somewhat inefficient for variables with non-Boolean types.

It is inefficient to check constructivity by enumerating all possible external valuations. Symbolic algorithms for checking constructivity manipulate sets of input valuations, representing them with BDD's. See R. Bryant, "Graph based algorithms for boolean function manipulation", *IEEE Transactions on Computers*, 1986; and G. Berry, "The Constrictive Semantics of Esterel", Draft book, available at ftp://ftp-sop.inria.fr/meije/esterel/parers/constructiveness.ps.gz, 1995; the Shiple, G. Berry and H. Touati publication; and the Shiple PhD dissertation. This manipulation is based on simultaneous fixpoint equations derived from the circuit definitions and the types of the variables. For variables with k values in their type, these algorithms require k sets of valuations for each variable. Moreover, for arithmetic operations, the fixpoint equations are constructed from partitions (for +) or factorizations (for *) of all numbers in the type. Thus, these algorithms are somewhat inefficient and difficult to implement for variables with non-Boolean types.

SUMMARY OF THE INVENTION

The formulation disclosed herein overcomes the prior art limitations by presenting a simple, non-computational definition of constructivity (Constructivity-SAT) and a symbolic algorithm based on the new formulation that is simple to implement for variables with arbitrary finite types. It is shown that, by simple transformation, one can reformulate constructivity as the satisfiability of a set of equations derived from the definitions, over variable types extended with a value $\bot$ (read as "bottom"). This formulation is non-computational and easily extensible to variables with any finite type. The formulation also handles definitions of indexed variables in the same manner. This constructivity check was implemented in COSPAN, which is the verification engine for the commercially available FormalCheck verification tool. The implementation is simple, and experience indicates that it usually incurs negligible overhead.

DETAILED DESCRIPTION cyclic definitions

Figure 1:
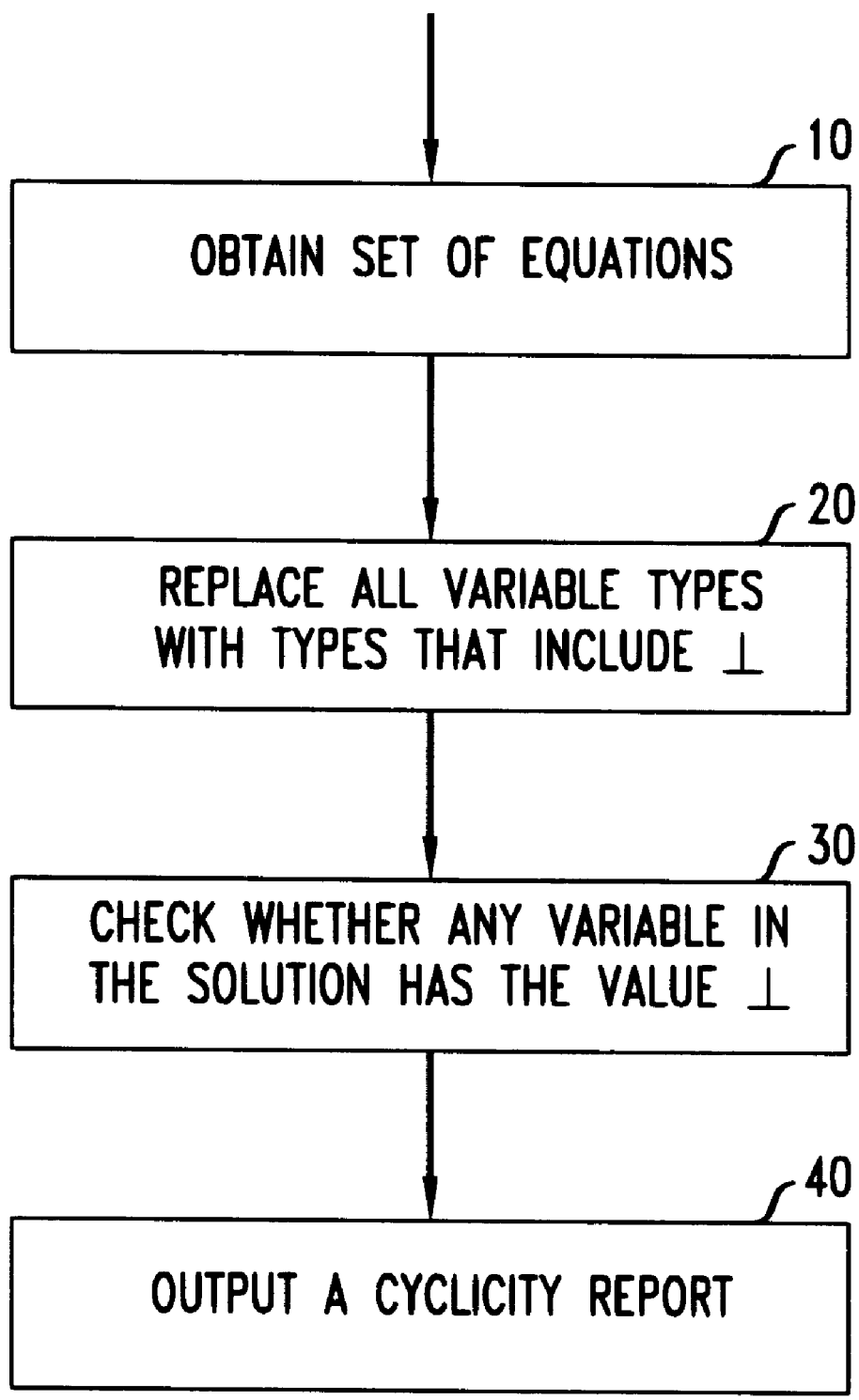
FIG. 1 presents a flowchart of the method disclosed herein.

Notation: The notation generally follows the style employed by E. W. Dijkstra and C. S. Scholten in "Predicate Calculus and Program Semantics", Springer Verlag, 1990. Function application is represented with a "." and is right-associative; for instance, $f.g.a$ is parsed as $f.(g.a)$. Quantified expressions and those involving associative operators are written in the format $(Qx{:}r.x{:}g.x)$, where Q is ether a quantifier (e.g. $\forall, \exists$) or an associative operator (e.g.,+, *, min, max, lup, glb), x is the dummy variable, r.x is the range of x, and g.x is the expression. For instance, ($\forall$x r(x)$\Rightarrow$g(x)) is expressed as ($\forall$x:r.x:g.x), ($\exists$x r(x)$\Rightarrow$g(x)) is expressed as ($\exists$x:r.x:g.x), and $$\sum_{i=0}^{n} x_i$$

is expressed as (+i:i $\in$[0,n]:x.i). When the ranger r is true or understood from the context, we drop it and write (Q x::g.x). Proofs are presented as a chain of equivalences or implications, with a suggestion for each link in the chain.

For simplicity, we consider all variables to be defined over a single finite type T. The vocabulary of operator symbols is given by the finite set F. Each symbol in F has an associated "arity", which is a natural number. A symbol $f$ with arity n corresponds to a function $f^*:T^N \rightarrow T$; symbols with arity 0 correspond to values of T. Terms over F and a set of variables X are built as follows: a variable in X is a term, and for terms t.i(i$\in$[0,n)) and a function symbol $f$ of arity n, $f$.(t.0, . . . ,t.(n-1)) is a term.

Definition 0 (Simultaneous definition). A simultaneous definition is specified by a triple (E,X,Y) where X and Y are disjoint finite sets of variables, E is a set of expressions of the form y::=t, where y$\in$Y, and t is a term in X$\cup$Y, such that there is exactly one expression in E for each variable in Y.

In terms of the earlier informal description of a circuit as a set of definitions, X is the set of "external" variables (the free inputs and latches) and Y is the set of "internal" variables (the internal gate outputs); notice that a simultaneous definition contains definitions only for the internal variables. A simultaneous definition induces a dependency relation among the variables in Y; for each expression y::=t, y "depends on" each of the variables appearing in t. A simultaneous definition is syntactically cyclic iff this dependency relation contains a cycle. The following illustrates with a few examples some of the subtleties in formulating a correct notion of semantic acyclicity.

Example 0: Syntactic Acyclicity

The external variable set is {x,y} and the internal variable set is {p,q}.

$p::=x \wedge \neg y$ $q::=x \vee y$ where $\wedge$ represents the intersection (AND) operation, $\Rightarrow$ represents the union (OR) operation, and $\neg y$ represents the negation of y. This is syntactically acyclic; hence, for every valuation of x and y, p and q have uniquely defined values.

Example 1: Syntactic Cyclicity, Semantic Acyclicity

The external variable set is {x,y} and the internal variable set is {p,q}.

$p::=$if $x$ then $y$ else $q$ $q::=$if $x$ then $p$ else $x$

This is syntactically cyclic (because a less than careful analysis suggests that a condition might occur where p::=q q::=p); however, with a more careful analysis it can be noted that if x is true, the definition simplifies to the acyclic definition:

$p::=y$ $q::=p$

Similarly, the simplified definition is acyclic when x is false. Thus, each setting of the external variable x breaks the syntactic cyclicity.

Example 2: Semantic Cyclicity

The external variable set is {xy} and the internal variable set is {p,q}.

$p::=q \wedge x$ $q::=p$

This is syntactically cyclic. If x is false, the simplified definition is acyclic; however, when x is true, it simplifies to one that presents a semantic cycle:

$p::=q$ $q::=p$

A plausible semantics for simultaneous definition is to interpret each expression y::=t as an equation y=t, and declare the definition to be semantically acyclic if this set of simultaneous equations has a solution for each valuation of the external variables. With this semantics, Examples 0 and 1 are semantically acyclic, but so is Example 2. One may attempt to rectify this situation by requiring there to be a unique solution for each input valuation; the following example illustrates that this is also incorrect.

Example 3: Incorrectness of the "Unique Solution" Criterion.

The external variable set is {x,y} and the internal variable set is {p,q}.

$p::=q \wedge x$ $q::=$if $p$ then $\neg q$ else false

This has the unique solution p=false, q=false. Hence, the definition has a unique solution for each valuation of x! The "unique solution" criterion thus leaves the cycles p::=p, q::=$\neg$q undetected.

The examples suggest that a straightforward formulation in terms of solutions to the simultaneous equations may not exist. Berry, strengthening a formulation of Malik, proposed a condition called Constructivity. Constructivity is based on the simplification process that was carried out informally in the examples above: for each valuation of the external variables, one attempts to simplify the right hand side of the definitions. If a term t in a definition y::=t simplifies to a constant a, the current valuation is extended with y=a, and the definition y::=t is removed. The simplifications are restricted to cases where the result is defined by the current valuation irrespective of the values of variables that are currently undefined. For instance, with {x=false} as the current valuation, "if x then y else z" simplifies to z; x$\wedge$y simplifies to false; but y$\vee\neg$y does not simplify to true. Berry shows that this process produces a unique result, independent of the order in which simplification steps are applied. The appropriateness of constructivity is shown in Shiple's Dissertation, where it is demonstrated that constructive definitions are precisely those that are well-behaved electrically, for any assignment of delay values, in the up-bounded inertial delay model (see J. A. Brzozowski and C-J. H. Seger, "Asynchronous Circuits", Springer Verlag, 1994). Malik shows that the problem of detecting semantic cyclicity is NP-complete.

Definition 1 (Constructivity). A simultaneous definition is semantically acyclic iff for each valuation of the external variables, the simplification process leads to an empty set of definitions.

Constructivity as Satisfiability

There is another way of viewing the simplification process that leads to our new formulation. Simplification is seen as a fixpoint process that computes the "maximal" extension of the original valuation of external variables (maximal in the sense that the set of definitions cannot be simplified further with this valuation). The algorithms for checking constructivity employed by Malik and Shiple use this fixpoint formulation. Theorem 1, below, shows that it is possible to recast the fixpoint formulation as a satisfiability question. This observation lets us develop a simple algorithm for constructivity that extends to non-Boolean types.

To formulate the simplification as a fixpoint process, we need some well-known concepts from Scott's theory of Complete Partial Orders (CPO's). See D. S. Scott. "A type-theoretical alternative to CUCH, ISWIN, OWHY", Unpublished notes, Oxford, 1969, *Published in Theoretical Computer Science,* 1993. The type T is extended with a new element, $\bot$ (read as bottom) to form the type $T_\bot$. $T_\bot$ is equipped with the partial order $\diamond$, defined by a $\diamond$ b iff a=b or a=$\bot$. Note that $\diamond$ is a CPO (every sequence of elements that is monotonically increasing w.r.t. (with respect to) $\diamond$ has a least upper bound (lub)). The greatest lower bound (glb) of two elements a,b is defined as: glb.(a,b)=if a≠b then $\bot$ else a. The ordering $\diamond$ is extended point-wise to vectors on $T_\bot$ by u⊂v (read "u below v") iff$|u|=|v|\Rightarrow(\forall i::u.i \diamond v.i)$. This ordering is a CPO on the set of vectors on $T_\bot$. The greatest lower bound is also defined point-wise over vectors of the same length: glb.(u,v)=w, where for every i, w.i=glb.(u.i,v.i).

For each function symbol $f$ in F, $f_\bot$ is a symbol of the same arity that indicates application to $T_\bot$ rather than to T. The interpretation $f^*_\bot$ of $f_\bot$ over $T_\bot$ should be a function that extends $f^*$ and is monotone w.r.t. the order ⊂; i.e., for vectors u,v of length the arity of $f_\bot$, u⊂v implies $f^*_\bot.u \subset f^*_\bot.v$. The ordering ⊂ and the monotonicity condition encodes the informal description of $\bot$ as the "undefined" value: if v is "more defined" than u, then $f^*_\bot.v$ should be "more defined" than $f^*_\bot.u$. The extension of a term t is represented by $t_\bot$ and is defined recursively based on the structure of the term: $(x)_\bot=x$; $(f.(t.0, \ldots, t.(n-1)))_\bot=f_\bot.(t_\bot.0, \ldots, t_\bot.(n-1))$. It is straightforward to show that the interpretation of an extended term is also monotonic w.r.t ⊂. Every monotonic function on a CPO has a least fixpoint.

A partial valuation constructed during the simplification process can now be represented as a total function from X∪Y to $T_\bot$, where currently undefined variables are given the value $\bot$. An initial valuation V is a function that maps X into T and Y to $\{\bot\}$. At each step, for some non-deterministically chosen definition y::=t, the current valuation V is updated to V.[y←$t^*_\bot$.V]. By an argument presented by H. Bekic, in "Definable operations in general algebra, and the theory of automata and flowcharts", *Technical Report, IBM,* 1969, Reprinted in "Programming Languages and Their Definitions", LNCS 177, 1984, and P. Cousot, in "Asynchronous iterative methods for solving a fixed point system of monotone equations in a complete lattice (rapport de recherche r.r. 88), Technical report, Laboratiore IMAG, Universite scientifique et me'dicale de Grenoble, 1978, based on monotonicity, this non-deterministic process terminates with a valuation that is the simultaneous least fixpoint of the derived set of equations $\{y=t^*_\bot|(y::=t)\in E\}$. For a simultaneous definition C=(E,X,Y), let (lfp Y: E*.(X, Y)) denote this least fixpoint. The fixpoint depends on, and is defined for, each valuation of X. The constructivity definition can now be restated as follows.

Definition 2 (Constructivity-FIX). A simultaneous definition (E,X,Y) is semantically acyclic iff for each initial valuation V, the vector (lfp Y: E*.(V,Y)) has no $\bot$-components.

For a vector v over $T_\bot$, let $\bot$free.v be the predicate $\forall i::v.i\neq\bot$. The constructivity condition is precisely ($\forall v$: $\bot$free.v: $\bot$free.(lfpY: E*.(v,Y))). Malik checks a weaker condition in which the set of internal variables Y has a subset of "output" variables W. Let output$\bot$free.v be the predicate ($\forall i::i \in W:v.i\neq\bot$). Malik's condition can be phrased as ($\forall v$: $\bot$free.v: output$\bot$free.(lfpY: E*.(v,Y))).

Checking the Constructivity-FIX condition independently for each initial valuation is inefficient. Malik, Berry, Touati and Shiple use a derived scheme that operates on sets of external valuations. If the type T has k elements, the scheme associates k subsets with each variable y in Y; the set y.i, i∈[0,k), contains external valuations for which the variable y evaluates to i. These subsets are updated by set operations derived from the semantics of the basic operators. For instance, for the definition "x::=y⇒z", the updates are given by x.false=y.false∪z.false, and x.true=y.true∩z.true.

This scheme has two limitations that arise for non-Boolean types: (i) the algorithm has to maintain k sets for each variable, and (ii) the set operations needed can be quite complex when the basic operators include (bounded) arithmetic. For example, for the definition x::=y+z, x.k would be defined as y.l+z.m for various partitions of k as l+m. Similarly, for x::=y*z, x.k would be defined as y.l*z.m for various factorizations of k as l*m. Our new formulation, Constructivity-SAT, changes Constructivity-FIX to a satisfiability question and avoids these difficulties.

The new formulation strengthens the Constructivity-FIX definition to require that every fixpoint of E* is $\bot$-free. The equivalence of the two formulations is shown in Theorem 1.

Definition 3 (Constructivity-SAT). A simultaneous definition (E,X,Y) is semantically acyclic iff ($\forall v,u$: $\bot$free.v⇒u=E*.(u,v):$\bot$free.u).

Lemma 0. For a monotone property P and a monotone function $f$ on a CPO ⊂,P.(lfp X:$f$.X) iff ($\forall u:u=f.u:P.u$).

Proof. The implication form right to left is trivially true, as (lfX: $f$.X) satisfies the condition u=$f$.u. For the other direction, note that the fixpoints of f are partially ordered by ⊂, with the least fixpoint below any other fixpoint. By the monotonicity of P, if P holds for the least fixpoint, it holds for every fixpoint.

Theorem 1. Constructivity-FIX and Constructivity-SAT are equivalent.

Proof. For any simultaneous definition C=(E,X,Y),

C satisfies Constructivity-FIX

≡($\forall v$:$\bot$free.v:$\bot$free.(lfpY:E*.(v,Y))), by definition

≡($\forall v$:$\bot$free.v:($\forall u:u=E^*.(v,u):\bot$free.u)), by $\{\bot$free is monotone w.r.t ⊂; Lemma 0$\}$ ≡($\forall v,u$: $\bot$free.v⇒u=E*.(v,u):$\bot$free.u), by rearranging ≡C satisfies Constructivity-SAT, by definition.

The extension of a function $f$ from T" to T"$_{195}$ can be defined in general as follows: the value of the extension at a vector v is the greatest lower bound of the function values at $\bot$-free vectors above v in the order. Formally, $$f^*_\bot.v=(glb\ w:\bot free.w \wedge v \subset w:f^*.w).$$

It is straightforward to show that this is a monotone extension of $f$. The extensions of basic arithmetic and Boolean functions are easily determined by this formula. For example, the extension of ⇒ is given by:

$$u \wedge_\perp v = \begin{cases} \text{false} & \text{if } u = \text{false or } v = \text{false; otherwise} \\ \perp & \text{if } u = \perp \text{ or } v = \perp; \text{ otherwise} \\ u \wedge v \end{cases}$$

To illustrate the general formulation, we check that $u \Rightarrow_{195}$ false = (glb x,y:x≠⊥∧y≠⊥∧u ◇ x∧false ◇ y:x∧y), by the general formulation
= (glb x:x≠⊥∧u ◇ x:x∧false), by definition of ◇
= (glb x:x≠⊥∧u ◇ x: false), by definition of ∧
= false, by definition of glb.

The extension of * is similar to that of ∧, with 0 substituted for false. The extension of + is given below $$u +_\perp v = \begin{cases} \perp & \text{if } u = \perp \text{ or } v = \perp; \text{ otherwise} \\ u + v \end{cases}$$

The extensions of other basic operators can be defined equally easily, as demonstrated by the Appendix at the end of this disclosure. The new formulation thus overcomes both the limitations of the earlier one. The extensions are easy to define and compute, and we do not need to maintains sets of valuations for each variable; the only changes required are to extend both the types of variables and the definitions of the basic operators.

In many input languages, including the S/R language of the COSPAN system, it is possible to declare arrays of variables. If z is such an array variable, definitions of the form z[c]::=t, where c is a constant, can be handled with the machinery presented earlier, by treating z[c] as an ordinary variable. A definition of the form z[e]::=t, where e is a non-constant term cannot, however, be handled with the earlier machinery, as it corresponds to the set of definitions {z[c]::=if (e=c) then t|c ∈indices(z)}. Notice that the term if (e=c) then t is apartial function. As a typical instance, consider the following definition, where z is an array indexed by {0,1}, and x and y are variables.

$z[x]::=a$ $z[y]::=b$

The semantics of S/R require that the valuations of x and y be distinct. The defining term for z[0] is the partial function if x=0 then a else if y=0 then b. This term may itself be considered as a partial function on $T_\perp$, defined only for x=0 and y=0. With this interpretation, it is monotonic w.r.t. ⊂. (A partial function $f$ is monotonic w.r.t a partial order ◇ iff whenever x ◇ y and $f$ is defined at x, $f$ is defined at y and $f$.x ◇ $f$.y.) Recombining the terms for z[0] and z[1], one obtains the following modification (for $T_{195}$) of the original definitions for z[x] and z[y].

$z[x]::=if x \neq \perp$ then $a$ $z[y]::=if y \neq \perp$ then $b$

These definitions contribute in the following way to the induced "equations":

$x \neq \perp \Rightarrow (z[x]=a)$ $y \neq \perp \Rightarrow (z[y]=b)$.

Implementation

We have implemented this new formulation in the COSPAN/FormalCheck verification system. The input language for the COSPAN system is S/R ("selection/resolution"), described in K. Katzenelson and R. P. Kurshan, "S/R: A language for specifying protocols and other coordinating processes", in *Proc. IEEE Conf. Comput. Comm.*, pages 286–292, 1986. An S/R program consists of a number of processes which may be viewed as Mealy machines with Rabin/Streett-type acceptance conditions. The variables of each process are either state or selection variables. Selection variables, in turn, are either free (unconstrained) inputs or combinational variables used to determine the next-state relation of the system. In the terminology employed above, the state variables together with the free variables form the "external" variables, since the inputs and state variables do not change value for the duration of the selection cycle; the other selection variables form the "internal variables".

There are no restrictions in S/R on the dependencies between selection variables. Selection variables declared within a process may be mutually interdependent and may be used as inputs to other processes, thus potentially introducing syntactic cycles that span process boundaries. In addition, the presence of semantic cycles may depend on the valuation of the state variables. For instance, a semantic cycle may be "unreachable", if the particular states in which it is induced are unreachable. The question, then, is to identify whether any semantic cycles are present in reachable states of the program for some free-input valuations (this problem is shown to be PSPACE-complete in Shiple's dissertation).

The S/R compiler parses the program and analyzes syntactic dependencies among internal variables. If there is a syntactic cycle, it identifies a set of internal variables whose elimination would break each syntactic cycle; such a set is commonly called a "feedback vertex set". The parser retains the variables in the feedback vertex set, and macro-expands the other variables, so that the variables in the feedback vertex set are defined in terms of themselves and the input variables, and their defining terms form the simultaneous definition that is to be analyzed. We will refer to these internal variables as the "relevant" variables.

Our implementation uses a single MTBDD terminal to represent ⊥. While MTBDD's for multiplication are exponential in the number of bits, they represent most other operations efficiently and are therefore used in COSPAN. The types of the relevant variables are extended to include the ⊥-terminal. The types of input and state variables are not extended. The implementation includes a library of extended basic operators, as defined herein. These extend the basic operators of S/R, including Boolean operators, arithmetic operators such as +, *, div, exp, mod, and conditional operators such as if-then-else.

Each definition x::=t of a relevant non-indexed variable is converted to the equation $x = t*_\perp$, while a definition z[e]::=t of an indexed variable is converted to $(e*_\perp \neq \perp) \Rightarrow (z[e*_\perp] = t*_\perp)$, as described above. To illustrate further, a circuit definition x::=A∧B would convert to $x::= A_\perp \wedge_\perp B_\perp$, a circuit definition z[j]=A where j is merely a dummy variable would convert to $z[j] = A_\perp$, while a circuit definition z[x]=A where x is a variable would convert to $(x_\perp \neq \perp) \Rightarrow (z[x_\perp] = A_{195})$. The conjunction of these formulae forms the simultaneous fix-point term Y=E*.(S,X,Y), where S is the set of state variables, X is the set of free input variables, and Y is the set of relevant variables. The Constructivity-SAT formula determines (by negation) the following predicate on state variables:

Cyclic.$S = (\exists X, Y :: Y = E*.(S,X,Y) \wedge \neg \perp \text{free}.Y)$.

The predicate ¬Cyclic is checked for invariance during reachability analysis; if it fails, the system automatically generates an error-track leading from an initial state to a state s such that Cyclic.s is true. It is not difficult to recover the set of variables involved in a semantic cycle for a particular input k at state s by inspecting the BDD for $(Y=E^* \cdot (s,k,Y) \wedge \neg \bot free.Y)$–every path to the 1-node includes variables that have value $\bot$; these variables are involved in a semantic cycle.

FIG. 1 presents a flowchart of the method disclosed herein. In block 10 the set of equations that represent a given circuit to be tested for cyclicity is obtained. In block 20, each variable in the equations of the set that corresponds to an internal variable of the circuit (as contrasted to a variable that corresponds to a signal that is applied from external sources or from clocked delay elements) is replaced with a variable whose type is extended to include the $\bot$. In block 30, the resulting set of equations is applied to a conventional equation solver that effectively solves the set of simultaneous equations. The actual solution need not be arrived at, however. Rather, a conclusion must be reached whether the solution will result in any variable assuming the value $\bot$. If so, then it is concluded that the circuit contains a syntactic cyclicity. The equation solver of block 30 can be any of the known commercial solvers. We used the BDD (Binary Decision Diagram) Satisfaction Checker in COSPAN, but other packages exist, such as a BDD package offered by Carnegie Mellon, and a BDD package offered by Colorado University. It may be noted that some solver packages may be designed for only two-valued variables. Nevertheless, these packages can be used in conjunction with the method of FIG. 1 by simply replacing each variable with two variables, thereby gaining the additional freedom to incorporate the value $\bot$ in the type definition.

APPENDIX

This Appendix contains the definitions of the extended basic operators of S/R.

Boolean Operators:

| | | | | |
|---|---|---|---|---|
| $u \wedge_\bot v =$ | false | if u = false or v = false; | otherwise, | |
| | $\bot$ | if u = $\bot$ or v = $\bot$; | otherwise, | |
| $u \vee_\bot v =$ | $u \wedge v$ | if u = true or v = true; | otherwise, | |
| | true | if u = $\bot$ or v = $\bot$; | otherwise, | |
| | $\bot$ | | | |
| $\neg_\bot u =$ | $u \vee v$ | if u = $\bot$; | otherwise, | |
| | $\bot$ | | | |
| | $\neg u$ | | | |

Arithmetic Operators:

| | | | |
|---|---|---|---|
| $u +_\bot v =$ | $\bot$ | if u = $\bot$ or v = $\bot$; | otherwise, |
| | $u + v$ | | |
| $u *_\bot v =$ | 0 | if u = 0 or v = 0; | otherwise, |
| | $\bot$ | if u = $\bot$ or v = $\bot$; | otherwise, |
| | $u*v$ | | |
| $u \text{ div}_\bot v =$ | 0 | if u = 0; | otherwise, |
| | $\bot$ | if (u = $\bot$ and v $\neq$ 0) or v = $\bot$; | otherwise, |
| | $u \text{ div } v$ | | |
| $u \text{ mod}_\bot v =$ | 0 | if u = 0 or v = $\bot$; | otherwise, |
| | $\bot$ | if (u = $\bot$ and v $\neq$ 0) or v = $\bot$; | otherwise, |
| | $u \text{ mod } v$ | | |
| $u \text{ exp}_\bot v =$ | 0 | if u = 0; | otherwise, |
| | 1 | if u = $\bot$ or v = 0; | otherwise, |
| | $\bot$ | if u = $\bot$ or v = $\bot$; | otherwise, |
| | $u \text{ exp } v$ | | |

APPENDIX-continued

This Appendix contains the definitions of the extended basic operators of S/R.

Comparison Operators:

| | | | |
|---|---|---|---|
| $u <_\bot v =$ | $\bot$ | if u = $\bot$ or v = $\bot$; | otherwise, |
| | $u < v$ | | |
| $u \leq_\bot v =$ | $\bot$ | if u = $\bot$ or v = $\bot$; | otherwise, |
| | $u \leq v$ | | |
| $u =_\bot v =$ | $\bot$ | if u = $\bot$ or v = $\bot$; | otherwise, |
| | $u = v$ | | |

Conditional Operators:

| | | | |
|---|---|---|---|
| (if c then u else v)$_\bot$ = | u | if c = true; | otherwise, |
| | v | if c = false; | otherwise, |
| | u | if c = $\bot$ and u = v; | otherwise, |
| | $\bot$ | if c = $\bot$ and u $\neq$ v | |
| (if c then u)$_\bot$ = | u | if c = true | |

We claim:

1. A method for evaluating a circuit for cyclic behavior, said circuit being specified in terms of a set of definitions specifying gates in the circuit and said definitions being characterized by one or more variables, the method comprising the steps of:

converting at least some of the variables in said set of definitions to a variable type that includes the $\bot$ value, to form thereby, in a single pass through said set of definitions, a set of modified definitions;

ascertaining whether the solution of said set of modified definitions contains any variable whose value is $\bot$; and based on a resultant of the ascertaining step, outputting an indication of whether the circuit under evaluation is a constructive circuit.

2. The method of claim 1 where said step of ascertaining is carried out by solving the set of simultaneous equations represented by said set of modified definitions.

3. The method of claim 1 further comprising a step of reporting a cyclicity condition when said solution reveals that at least one of said variables has the value $\bot$.

4. The method of claim 1 where said at least some of the variables form a subset of said variables that correspond to internal variables.

5. The method of claim 1 where said at least some of the variables form a subset of said variables that correspond to other than external variables.

6. The method of claim 5 where said external variables correspond to input variables and clocked delay elements.

7. The method of claim 1 further comprising a step of developing said set of definitions from a specification of a circuit.

8. The method of claim 1 where a definition of the type $(z[x]A)$, where x is an internal variable and A is another internal variable, and z is an indexed variable, converts to $(x_{195} \neq \bot) \Rightarrow (z[x_{195}] = A_{195})$.

* * * * *